United States Patent [19]

Rumennik

[11] 4,220,963
[45] Sep. 2, 1980

[54] FAST RECOVERY DIODE WITH VERY THIN BASE

[75] Inventor: Vladimir Rumennik, El Segundo, Calif.

[73] Assignee: International Rectifier Corporation, Los Angeles, Calif.

[21] Appl. No.: 960,592

[22] Filed: Nov. 14, 1978

[51] Int. Cl.³ ............................................. H01L 29/06
[52] U.S. Cl. ........................................ 357/55; 357/14; 357/86
[58] Field of Search ............................ 357/55, 86, 14

[56] References Cited

U.S. PATENT DOCUMENTS

| | | | |
|---|---|---|---|
| 3,317,746 | 5/1967 | Hutson | 307/88.5 |
| 3,453,508 | 7/1969 | Weinstein | 317/235 |
| 3,553,536 | 1/1971 | Neilson | 317/235 |
| 4,109,274 | 8/1978 | Belenkov | 357/38 |

Primary Examiner—Martin H. Edlow
Attorney, Agent, or Firm—Ostrolenk, Faber, Gerb & Soffen

[57] ABSTRACT

A fast recovery diode consists of a relatively thick wafer of monocrystalline silicon material which has a relatively deep central well therein. The central well defines a relatively thin intermediate base region for the diode which is surrounded by a relatively thick rim region which imparts physical strength to the wafer. The upper periphery of the rim is surrounded by a conductivity-type material which is opposite to that of the base, but is short-circuited by the contact on the well side of the wafer.

7 Claims, 6 Drawing Figures

FAST RECOVERY DIODE WITH VERY THIN BASE

BACKGROUND OF THE INVENTION

This invention relates to semiconductor devices, and more specifically relates to a fast recovery diode which has an extremely thin base, but has a relatively rugged structure.

Fast recovery diodes are known which might have a recovery time of about 200 nanoseconds with a reverse voltage capability of about 500 volts. When such fast recovery diodes are to have a relatively high current capacity, they must be made of a relatively large area monocrystalline wafer. When this wafer becomes very large in diameter, for example greater than ½ inch, the need for the extremely thin base which gives the device its fast recovery time makes the entire wafer so fragile that it is easily broken during manufacture and assembly.

By way of example, for a 200 nanosecond device, the base region of the diode should be about 1½ mils thick. This extremely thin region, however, is very fragile, particularly when it has a relatively largr area.

It is known that an extremely thin wafer can be made with a thickened peripheral region to give it structural strength. Such a device is shown in U.S. Pat. No. 3,553,536 in the name of Neilson.

BRIEF DESCRIPTION OF THE INVENTION

The present invention provides a novel very high recovery speed device which can be easily manufactured by conventional manufacturing techniques, wherein the peripheral rim which reinforces the device is made of a conductivity-type material which is opposite to that of the base region, but is short-circuited by an electrical contact to prevent the formation of a multijunction region on the periphery of the main diode structure.

In accordance with one form of the present invention, an N-type wafer is provided with two P-type diffused regions on the opposite surfaces of the wafer to define a remaining central N-type region which is extremely thin, for example, 1½ mils.

A deep well is then etched into the center of the wafer with the bottom of the well extending into the N-type central region. A shallow N+ region is then formed over the full exposed surface of the well and the peripheral rim and a contact is formed over this N+ region. The N+ region and contact short-circuits the P-type rim material and prevents the operation of the junction formed between the P-type rim and the central N-type region. The resulting device is then a diode having a very thin N base region which will impart extremely high speed recovery characteristics to the device while permitting the device to have a relatively large area without the attendant mechanical problems of a very thin, unreinforced wafer.

BRIEF DESCRIPTION OF THE DRAWINGS

FIG. 3b is a plan view of the upper surface of the wafer of FIG. 3a.

DETAILED DESCRIPTION OF THE DRAWINGS

Figure 1:
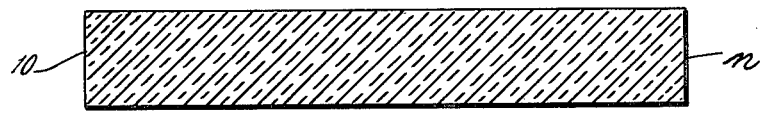
FIG. 1 is a cross-sectional view of an initial wafer to which the process of the present invention is applied. The thickness dimensions of the wafer are greatly exagerated in this and succeeding figures.

FIG. 1 is a cross-sectional view of a wafer or chip of semiconductor material, preferably monocrystalline silicon, which can, for example, have a thickness of 9 mils and a diameter up to 3 inches. In the embodiment to be described, the diameter of the wafer of FIG. 1 is about 0.7 inch.

The initial N-type material will have a conductivity, for example, of 5 to 10 ohm-centimeters.

It is desired to convert the wafer of FIG. 1 into a fast recovery diode which is one which will have a thin base region of N-type material which might have a thickness, for example, of about 1½ mils to produce a 500 volt, 200 nanosecond device.

Figure 2:
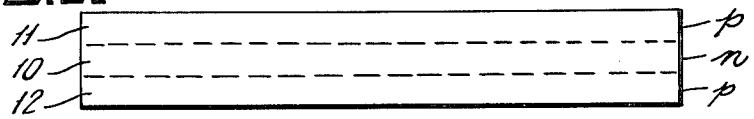
FIG. 2 shows the wafer of FIG. 1 after a P-type diffusion into the opposite surfaces of the wafer.

The first step of the process of manufacture is shown in FIG. 2 wherein P-regions 11 and 12 are diffused into the N-type wafer 10. The P-type regions 11 and 12 may each have a depth of from 3 to 4 mils and may be formed by a conventional gallium diffusion operation. By way of example, the wafer may be stacked, along with a plurality of other identical wafers, in a diffusion furnace and can be diffused in the presence of a gallium source for about 25 hours at a temperature of about 1250° C.

This diffusion will leave the N-type region 10 in the center of the wafer with a thickness of from 1 to 3 mils which is suitable for the fast recovery device.

Figure 3A:
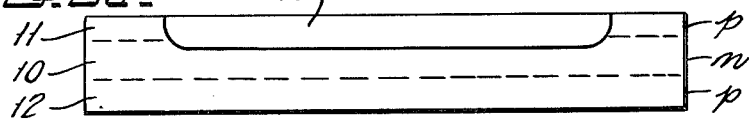
FIG. 3a shows the wafer of FIG. 2 after a central well has been formed in the wafer.
Figure 3B:
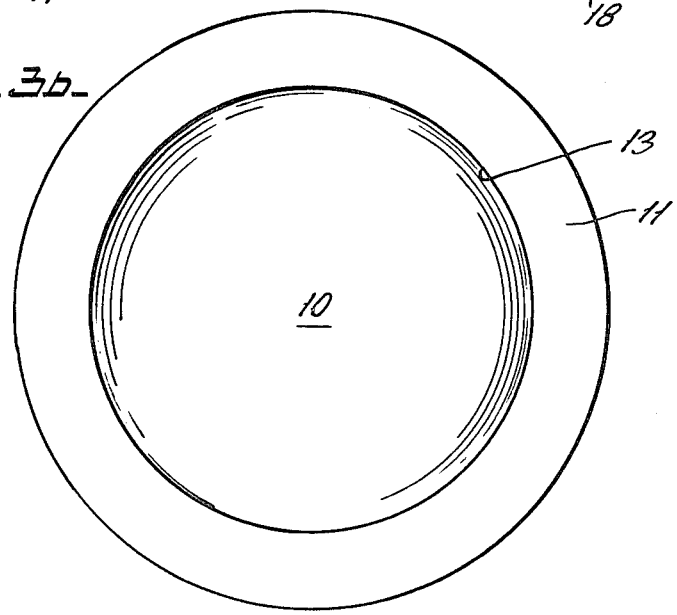

Thereafter, and as shown in FIGS. 3a and 3b, the upper surface of the wafer is provided with an annular mask and the bottom surface is fully masked and the wafer is immersed in a suitable etching material for etching a circular well 13 into the center of the wafer. By way of example, the well 13 may have a depth of about 5 mils and a diameter of 0.5 inch. Thus the bottom of the well will extend into the N-type region 10 of the wafer and will be surrounded by a relatively rigid rim formed of the P-type layer 11. Any typical acid etch or other suitable operation can be used to form the well 13. By way of example, the wafer can be immersed in CP-4 acid for about 1.5 minutes. The etch is completed when the resistivity of the bottom of the well is measured to be about 5 to 10 ohm-centimeters.

Note that in the past the common method for making a fast recovery diode would be to lap off or etch off the entire upper gallium diffused layer 11 to expose the entire surface area of the N-type region 10. This, however, made the wafer so thin and fragile that substantial breakage occurred during the processing operation and during succeeding process steps. With the present invention, the P-type rim which remains around the central depression 13 gives substantial mechanical strength to the wafer even though the wafer is relatively large in cross-sectional area.

Figure 4:
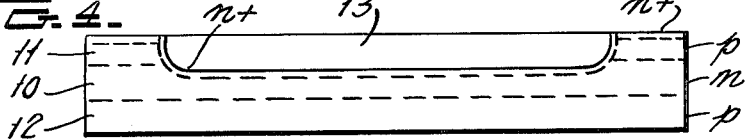
FIG. 4 shows the wafer of FIGS. 3a and 3b after the formation of a shallow N+ region over the surface of the well and the surface of the peripheral P-type rim.

Thereafter, and as shown in FIG. 4, the wafer is masked and placed in a diffusion furnace and a shallow phosphorus diffused region 14 is formed over the full upper surface of the wafer to convert the full area of the upper surface of the wafer to N+ conductivity. Note that this includes the surface of the P-type rim. Thus, the P-type rim is short-circuited to the N-type central region 10 by the very conductive N+ region 14. By way of example, the phosphorus diffusion step can be carried out in a suitable diffusion furnace for about 10 to 15 hours at 1150° C. using POcl₃ suspended in a suitable carrier gas passing over the wafer surface.

Figure 5:
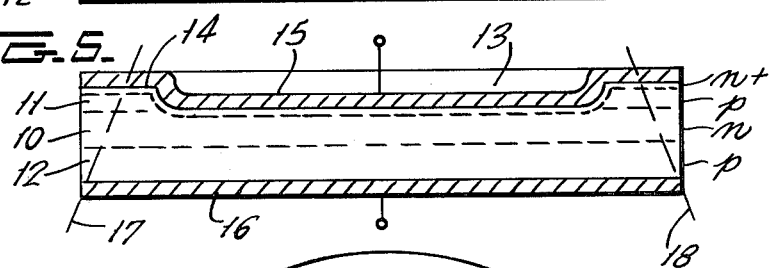
FIG. 5 shows the wafer of FIG. 4 after the application of contacts to the opposite surfaces of the wafer.

Following the formation of the phosphorus layer 14, the upper and lower surfaces of the wafer are suitably metallized as shown in FIG. 5 by the metallizing layers 15 and 16 which serve as the cathode and anode electrodes, respectively, for the device. Any typical metallizing system can be used. The upper electrode 15 can be aluminum if desired.

The completed device may then have its edges beveled as indicated by the dotted lines 17 and 18 to improve reverse voltage capability, and the device may then be suitably passivated and assembled into a suitable housing.

While the invention was described in connection with an initially N-type wafer, it will be understood to those skilled in the art that the device could have started with a P-type wafer and that the P-type material could have been used for the thin central base region with an N-type inert rim disposed above the P-type base.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. A large area fast recovery diode comprising a wafer of monocrystalline silicon having first and second parallel surfaces and a central well formed in said first surface and extending to a central region and surrounded by an integral peripheral rim; said wafer having a central thin layer of one of the conductivity types disposed beneath the bottom of said well and extending along the center of said wafer and over-lapping said peripheral rim; said integral peripheral rim being of the other of the conductivity types; and a flat region of the other of the conductivity types disposed adjacent said central layer and extending to said second surface and first and second electrodes fixed to and extending across said first and second surfaces; said first electrode extending into said central wall.

2. A large area fast recovery diode comprising a flat wafer of semiconductor material having generally parallel first and second major surfaces, and first and second layers of one conductivity type, and a central layer of another conductivity type disposed between and forming P-N junctions with said first and second layers; a central well formed in said first surface and extending through said first layer and having a bottom which reaches said central layer and exposes said central layer; said central well defining a thickened integral peripheral rim for said wafer which has a region formed principally of said one conductivity type extending above said bottom of said well; and a conductive layer extending across said first surface and interconnecting the top of said rim and the bottom of said well.

3. The diode of claim 2 which includes first and second electrodes fixed to and extending across said first and second surfaces; said first electrode extending into said depression and short-circuiting the junction between the material of said rim and the material of said central well.

4. The diode of claim 1 or 2 wherein said central layer has a thickness less than about 3 mils.

5. The diode of claim 1 or 3 wherein said central layer has a thickness less than about 3 mils.

6. The diode of claim 4 wherein said well is circular and has a diameter greater than about 0.5 inch, and wherein said rim has a radial thickness greater than about 0.1 inch.

7. The diode of claim 6 wherein said thickness of said wafer at said rim is about 9 mils.

* * * * *